United States Patent
Wang et al.

(10) Patent No.: US 12,013,638 B2
(45) Date of Patent: Jun. 18, 2024

(54) DUAL-CURE PHASE-SEPARATION TYPE PHOTOSENSITIVE RESIN COMPOSITION FOR CONTINUOUS 3D PRINTING WITH HIGH PRECISION

(71) Applicant: SUZHOU POLLY NEW MATERIAL TECH CO., LTD., Jiangsu (CN)

(72) Inventors: Wenbin Wang, Suzhou (CN); Jie Xiong, Suzhou (CN)

(73) Assignee: SUZHOU POLLY NEW MATERIAL TECH CO., LTD., Jiangsu (CN)

( * ) Notice: Subject to any disclaimer, the term of this patent is extended or adjusted under 35 U.S.C. 154(b) by 295 days.

(21) Appl. No.: 17/433,946

(22) PCT Filed: Nov. 4, 2020

(86) PCT No.: PCT/CN2020/126356
§ 371 (c)(1),
(2) Date: Aug. 25, 2021

(87) PCT Pub. No.: WO2021/218097
PCT Pub. Date: Nov. 4, 2021

(65) Prior Publication Data
US 2022/0342305 A1 Oct. 27, 2022

(30) Foreign Application Priority Data

Apr. 29, 2020 (CN) .......................... 202010356325.9

(51) Int. Cl.
| | | |
|---|---|---|
| G03F 7/035 | (2006.01) | |
| G03F 7/027 | (2006.01) | |
| G03F 7/031 | (2006.01) | |
| G03F 7/038 | (2006.01) | |
| B33Y 10/00 | (2015.01) | |
| B33Y 70/00 | (2020.01) | |

(52) U.S. Cl.
CPC .............. *G03F 7/035* (2013.01); *G03F 7/027* (2013.01); *G03F 7/031* (2013.01); *G03F 7/0382* (2013.01); *B33Y 10/00* (2014.12); *B33Y 70/00* (2014.12)

(58) Field of Classification Search
CPC .................................. G03F 7/035; G03F 7/027
See application file for complete search history.

(56) References Cited

U.S. PATENT DOCUMENTS

| | | | |
|---|---|---|---|
| 2015/0036902 A1 | 2/2015 | Zamyatin et al. | |
| 2017/0120515 A1 | 5/2017 | Rolland et al. | |

FOREIGN PATENT DOCUMENTS

| | | | |
|---|---|---|---|
| CN | 106796392 A | 5/2017 | |
| CN | 106833358 | 6/2017 | |
| CN | 106866929 | 6/2017 | |
| CN | 108139665 | 6/2018 | |
| CN | 108912286 | 11/2018 | |
| CN | 108929410 | 12/2018 | |
| CN | 109320666 | 2/2019 | |
| CN | 110982246 | 4/2020 | |
| CN | 111040102 | 4/2020 | |
| CN | 111349197 | 6/2020 | |
| WO | 2015200179 | 12/2015 | |
| WO | WO-2017112483 A2 * | 6/2017 | ........... B29C 64/129 |
| WO | WO-2017112571 A1 * | 6/2017 | ........... B29C 64/135 |
| WO | WO-2017112653 A1 * | 6/2017 | ............... A42C 2/00 |

OTHER PUBLICATIONS

Extended European Search Report issued for European Patent Application No. 20919361.4, dated Aug. 8, 2022, 6 pages.

* cited by examiner

*Primary Examiner* — John S Chu
(74) *Attorney, Agent, or Firm* — HSML P.C.

(57) ABSTRACT

The present disclosure relates to a dual-cure phase-separation type photosensitive resin composition for continuous 3D printing with high precision, including an acrylate having a cross-linkable double bond, a polyurethane prepolymer, a chain extender, and a photoinitiator. The polyurethane prepolymer is produced by a reaction between an isocyanate and a polyether polyol with a molecular weight larger than or equal to 4000 under heating and catalytic action. The photosensitive resin composition of the present disclosure is used in the continuous 3D printing to make high precision parts.

20 Claims, 2 Drawing Sheets ions of the present disclosure, but the process of implementing the present disclosure is not limited thereto.

DUAL-CURE PHASE-SEPARATION TYPE PHOTOSENSITIVE RESIN COMPOSITION FOR CONTINUOUS 3D PRINTING WITH HIGH PRECISION

TECHNICAL FIELD

The present disclosure relates to the technical field of 3D printing materials, and in particular to a dual-cure phase-separation type photosensitive resin composition for continuous 3D printing with high precision.

BACKGROUND 3D printing involves a process of generating a three-dimensional object from a digital file. 3D printing has a great freedom in creating a shape of an object, and is almost not limited by the complexity of the shape. The development trend of 3D printing is toward fast speed, high precision, low cost, and wide application. So far, 3D printing has evolved from model making to batch production and manufacture of final consumer goods. A photosensitive resin mainly includes an oligomer, a diluent, and a photoinitiator, and is solidified under the action of ultraviolet light. This principle is widely used in the light-curing 3D printing technology such as stereolithography (SLA) and digital light processing (DLP).

The patent application PCT/US2015/036902 filed by Carbon3D Inc. discloses a continuous liquid interphase printing (CLIP), using oxygen gas as a polymerization inhibitor to form a dead zone where no polymerization occurs, on the basis of DLP printing technology. Compared to the traditional 3D printing, the continuous liquid interphase printing has increased the printing speed by 100 times, becoming a revolutionary 3D printing technology and having been widely used in the polymer material processing. Carbon 3D Inc. also discloses a multiple solidifiable photosensitive resin material, which is a high performance 3D printing material obtained by curing a blocked polyurethane under the ultraviolet light and then unblocking and rearranging the polyurethane by heating. However, the unblocking temperature of the blocked polyurethane is relatively high, reaching 120° C., which causes a waste of energy and generates a lot of pollutants such as waste gases in the post-processing.

The continuous 3D printing, which is fundamentally different from the traditional light-curing 3D printing technology, abolishes the concept of layers and creates shapes rapidly through continuous irradiation of light. SLA and DLP both perform the printing in a layer-by-layer manner with a layer thickness of 20 to 120 μm. In the light-curing 3D printing, the liquid photosensitive resin irradiated by the ultraviolet light is transformed into the solid. The penetration depth (Dp) and the critical exposure (Ec) of the photosensitive resin have great impacts on success rate, precision, and surface quality of the 3D printing. If the penetration depth (Dp) is larger than the thickness of the layer of photosensitive resin, an excess part will be generated due to the overexposure, causing the low precision and the poor surface roughness of the product formed by the light curing. If the penetration depth (Dp) is smaller than the thickness of the layer, one layer cannot be well bonded to another layer, causing the failure of printing. At present, for the ordinary DLP and SLA photosensitive resins, the penetration depth (Dp) and the critical exposure (Ec) thereof can be regulated by regulating a ratio of the initiator to the pigment paste, to achieve a relatively good surface quality. However, for the 3D printing with continuous irradiation, the ultraviolet light irradiates continuously, and thus it is difficult to precisely regulate the penetration depth (Dp) and the critical exposure (Ec) via the pigment paste and the initiator.

SUMMARY

A dual-cure phase-separation type photosensitive resin composition for continuous 3D printing with high precision includes an acrylate having a cross-linkable double bond, a polyurethane prepolymer, a chain extender, and a photoinitiator. Wherein the polyurethane prepolymer is a polyurethane prepolymer having an isocyanate active group (—NCO). The polyurethane prepolymer having the isocyanate active group (—NCO) is produced by a reaction between an isocyanate and a polyether polyol with a molecular weight larger than or equal to 4000 under heating and catalytic action.

In an embodiment, the photosensitive resin composition includes 5 to 30 parts by weight of the acrylate having the cross-linkable double bond, 65.2 to 70 parts by weight of the polyurethane prepolymer, 0.5 to 20 parts by weight of the chain extender, and 0.1 to 6 parts by weight of the photoinitiator with respect to 100 parts by weight of the photosensitive resin composition.

In an embodiment, the polyurethane prepolymer having the isocyanate active group (—NCO) is produced by the reaction between the isocyanate and the polyether polyol with a molecular weight of 5500 to 12000 under heating and catalytic action. In a further embodiment, the polyurethane prepolymer having the isocyanate active group (—NCO) is produced by the reaction between the isocyanate and the polyether polyol with a molecular weight of 8000 under heating and catalytic action.

In an embodiment, the polyurethane prepolymer having the isocyanate active group (—NCO) is produced by the reaction between the isocyanate and the polyether polyol with an average functionality of 2 to 3 under heating and catalytic action.

In an embodiment, the photosensitive resin composition satisfies the following condition: phase separation and whitening phenomenon occur in the photosensitive resin composition during the change of the photosensitive resin composition from liquid to solid. In an embodiment, the acrylate having the cross-linkable double bond is selected from an acrylate monomer having one or more double bonds capable of participating in free radical reaction, an acrylate prepolymer having one or more double bonds capable of participating in free radical reaction, and a combination thereof. In a further embodiment, the acrylate monomer having one or more double bonds capable of participating in free radical reaction is selected from a monofunctional acrylate monomer with a functionality equal to 1, a multi-functional acrylate monomer with a functionality larger than 1, and a combination thereof. In a further embodiment, the acrylate prepolymer having one or more double bonds capable of participating in free radical reaction is selected from polyurethane acrylate, epoxy acrylate, polyester acrylate, and combinations thereof.

In an embodiment, an amount of the isocyanate active group (—NCO) in the polyurethane prepolymer is 2 to 20 percent by weight. In a further embodiment, the isocyanate used in the reaction under heating is selected from at least one or a combination of toluene diisocynate (TDI), methylene diphenyl diisocyanate (MDI), hexamethylene diisocyanate (HDI), isophorone diisocyanate (IPDI), dicyclohexylmethane-4,4'-diisocyanate (HMDI), xylylene diisocynate (XDI), tetramethyl-m-xylylene diisocyanate (TMXDI), methylcyclohexane diisocyanate (HTDI), 1,4-phenylene diisocyanate (PPDI), norbornane diisocyanate (NBDI), and 1,4-cyclohexane diisocyanate (CHDI). In an embodiment, the polyether polyol is produced by addition polymerization of an initiator, ethylene oxide (EO), propylene oxide (PO), butylene oxide (BO) in the presence of a catalyst, wherein the initiator is a compound containing an active hydrogen group. The catalyst is an organobismuth catalyst, an organotin catalyst, or a combination thereof for the synthesis of polyurethane.

In an embodiment, the polyurethane prepolymer is synthesized by using the following method: (1) dehydrating the polyether polyol by vacuuming, wherein the vacuuming satisfies the condition: the temperature is 100 to 120° C., and the vacuum degree is −0.08 to −0.1 MPa; (2) adding weighed isocyanate and 0.01 to 0.2 parts by weight of the catalyst, and then reacting at 60 to 90° C. for 3 to 5 hours.

In an embodiment, the chain extender is a polyol, a polyamine, or an alkylol amine, with a functionality of 2 to 4.5 and a molecular weight smaller than 500.

In an embodiment, the chain extender is selected from at least one or combinations of ethylene glycol, propylene glycol, 1,4-butanediol, diethylene glycol, glycerol, trimethylolpropane, 1,4-cyclohexanediol, dimethylene benzenediol, hydroquinone di-p-hydroxyethyl ether, resorcinol hydroxy ether, diethyl toluene diamine, 3,5-dimethyl thiotoluene diamine, ethanol amine, diethanol amine, triethanol amine, triisopropanol amine, and N,N'-bis(2-hydroxypropy) aniline.

In an embodiment, the photoinitiator is selected from at least one or combinations of 2,4,6-trimethylbenzoyl ethylphosphinate, 2,4,6-(trimethylbenzoyl)-diphenyl phosphine oxide (TPO), 2-methyl-1-[4-methylthiophenyl]-2-morpholinyl-1-propanone, 2-isopropylthioxanthone (2, 4 isomer mixture), ethyl 4-dimethylamino benzoate, 1-hydroxy-cyclohexyl-phenyl ketone, 2-hydroxy-2-methyl-1-pheny-1-propanone, benzoin dimethyl ether, o-benzoyl benzomethoxycarbonyl, 4-chlorobenzophenone, and 4-phenylbenzophenone.

In an embodiment, the photosensitive resin composition includes 10 to 30 parts by weight of the acrylate having the cross-linkable double bond, 65.2 parts by weight of the polyurethane prepolymer, 1 to 10 parts by weight of the chain extender, 0.3 to 5 parts by weight of the photoinitiator, 0.1 to 1 part by weight of a pigment, and 0.1 to 20 parts by weight of an additive with respect to 100 parts by weight of the photosensitive resin composition, wherein the pigment is a pigment paste curable under UV. The additive includes an antioxidant, a light stabilizer, and a filler.

The advantages of the technical solution of the present disclosure will be described in detail in the following embodiments in combination with the examples.

DETAILED DESCRIPTION

Figure 1:
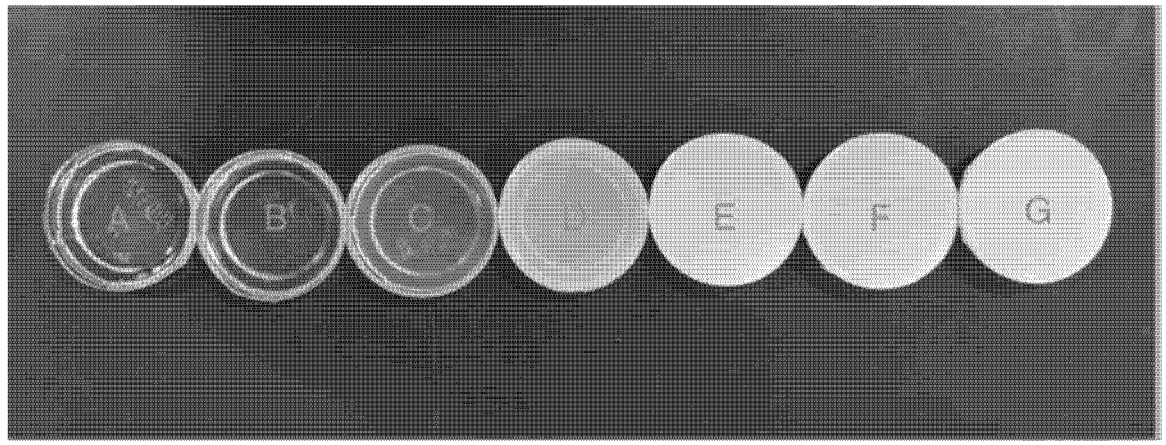
FIGS. 1 to 2 show effect photos of solid objects after the photosensitive resin compositions of Comparative Examples 1 to 3 and Examples 1 to 7 of the present disclosure are solidified.

The present disclosure will be further illustrated below by means of the specific embodiments. The following examples are the specific embodiments of the present disclosure. However, the embodiments of the present disclosure are not limited to the following examples. Any other change, modification, substitution, combination, and simplification without departing from the spirit and principle of the present disclosure are all included in the protection scope of the present disclosure.

According to an embodiment of a dual-cure phase-separation type photosensitive resin composition for continuous 3D printing with high precision, the photosensitive resin composition includes: (i) an acrylate having a cross-linkable double bond; (ii) a polyurethane prepolymer; (iii) a chain extender; and (vi) a photoinitiator.

With respect to 100 parts by weight of the photosensitive resin composition, weight proportions of respective components are as follows: 5 to 50 parts by weight of the acrylate having the cross-linkable double bond, 5 to 70 parts by weight of the polyurethane prepolymer, 0.5 to 20 parts by weight of the chain extender, and 0.1 to 6 parts by weight of the photoinitiator. In an embodiment, the acrylate having the cross-linkable double bond takes 10 to 40 parts by weight, the polyurethane prepolymer takes 20 to 60 parts by weight, the chain extender takes 1 to 10 parts by weight, and the photoinitiator takes 0.3 to 5 parts by weight.

The polyurethane prepolymer can be a polyurethane prepolymer having an isocyanate active group (—NCO). The polyurethane prepolymer having the isocyanate active group (—NCO) can be produced by a reaction between an isocyanate and a polyether polyol with a molecular weight larger than or equal to 4000 under heating and catalytic action.

In an embodiment, the polyurethane prepolymer having the isocyanate active group (—NCO) is produced by the reaction between the isocyanate and the polyether polyol with a molecular weight of 5500 to 12000 under heating and catalytic action. In a further embodiment, the polyurethane prepolymer having the isocyanate active group (—NCO) is produced by the reaction between the isocyanate and the polyether polyol with a molecular weight of 8000 under heating and catalytic action.

In an embodiment, the polyurethane prepolymer having the isocyanate active group (—NCO) is produced by the reaction between the isocyanate and the polyether polyol with an average functionality of 2 to 3 under heating and catalytic action.

In an embodiment, the photosensitive resin composition satisfies the following condition: obvious phase separation and obvious whitening phenomenon occur in the photosensitive resin composition during the change of the photosensitive resin composition from liquid to solid.

The components mentioned above will be described in detail in combination with the embodiments as follows.

(i) the acrylate having the cross-linkable double bond can be an acrylate monomer having one or more double bonds capable of participating in free radical reaction, an acrylate prepolymer having one or more double bonds capable of participating in free radical reaction, or a mixture thereof. Wherein the acrylate monomer having one or more double bonds capable of participating in free radical reaction can be selected from monofunctional, bifunctional, trifunctional, tetrafunctional, pentafunctional, hexafunctional, and multifunctional acrylate monomers.

The suitable acrylate monomers having one or more double bonds capable of participating in free radical reaction are available from various commercial sources, for example, including but not limited to SR295, SR444, DPHA, SR351, SR494, SR454, SR506, CD590, SR420, SR217, SR531, SR285, SR9003, SR306, SR508, SR259, SR268, SR231, SR206, SR595, SR205, SR239, SR214, SR252, SR297F NS, SR348, SR601, SR540, SR541, SR602, SR480, SR834, SR603, SR210, CD406, SR610, SR399, SR502, SR415, SR9020, SR368, SR350, SR9035, SR355, SR339, SR340, CD495B, SR203, SR421, SR423, SR789, SR504, SR833, SR349, SR238 from Sartomer; for example, including but not limited to EM210, EM2103, EM2108, EM211, EM212, EM21, EM2191, EM315, EM35, EM70, EM75, EM90, EM2202, EM221, EM2211, EM222, EM2222, EM223, EM2243, EM215, EM218, EM219, EM2241, EM225, EM2251, EM226, EM2261, EM2288, EM229, EM2265, EM227, EM2280, EM320, EM324, EM326, EM3260, EM3261, EM3265, EM328, EM329, EM39, EM2308, EM231, EM235, EM2380, EM2383, EM2384, EM2385, EM2386, EM2381, EM2382, EM2387, EM331, EM3380, EM241, EM2411, EM242, EM2421, EM243, EM265, etc. from Eternal Chemical; or can be made by known methods.

In an embodiment, the acrylate prepolymer having one or more double bonds capable of participating in free radical reaction is polyurethane acrylate, epoxy acrylate, polyester acrylate.

The suitable polyurethane acrylates, epoxy acrylates, and polyester acrylates are available from various commercial sources, for example, including but not limited to CN1964, CN8010, CN110, CN989, CN8887, CN980, CN7001, CN1963, CN9893, CN8888, CN8881, CN2282, CN978, CN2261, CN9001, CN2283, CN2254, CN2204, CN983, CN790, CN8004, CN159, CN153, CN117, CN981, CN2302, CN2303, CN2203, CN996, CN991, CN2262, CN9782, CN115, CN131, CN146, CN959, CN120, CN104, CN964, etc., from Sartomer; for example, including but not limited to Etercure 611A-85, 611B-85, 6112-100, 6121F-80, 6122F-80, 6130B-80, 6131-1, 6132, 6134B-80, 6136B-90, 6141H-80, 6142H-80, 6143A-80, 6144-100, 6145-100, 6146-100, 6147B-80, 6149-100, 615-100, 6161-100, 620-100, 621A-80, 621F-80, 6214X-60, 6210G, 6211-100, 6213-100, 6215-100, 6219-100, 622-100, 622A-80, 623-100, 624A-75, 6241-100, 6311-100, 6312-100, 6313-100, 6315, 6318, 6320, etc., from Eternal Chemical; or can be made by known methods.

(ii) In an embodiment, the amount of the isocyanate active group (—NCO) in the polyurethane prepolymer is 2 to 20 percent by weight with respect to the total weight of the polyurethane prepolymer.

The isocyanate includes but is not limited to one or more of toluene diisocynate (TDI), methylene diphenyl diisocyanate (MDI), hexamethylene diisocyanate (HDI), isophorone diisocyanate (IPDI), dicyclohexylmethane-4,4'-diisocyanate (HMDI), xylylene diisocynate (XDI), tetramethyl-m-xylylene diisocyanate (TMXDI), methylcyclohexane diisocyanate (HTDI), 1,4-phenylene diisocyanate (PPDI), norbornane diisocyanate (NBDI), and 1,4-cyclohexane diisocyanate (CHDI). The polyether polyol is produced by addition polymerization between an initiator (a compound containing an active hydrogen group) and ethylene oxide (EO), propylene oxide (PO), butylene oxide (BO), and the like in the presence of a catalyst.

In an embodiment, the polyurethane prepolymer is synthesized by using the following method: (1) dehydrating the polyether polyol by vacuuming at 115° C. for 4h with a vacuum degree of −0.08 to −0.1 MPa; (2) adding weighed isocyanate and 0.01 to 0.2 parts by weight of the catalyst, and then reacting at 80° C. for 3 to 5 h.

The polyether polyols are available from various commercial sources, for example, including but not limited to, Pluracol 1010, 1044, 1062, 2010, 628, 410R, 1026, 1070, 1421, 1538, 1603, 2009, 2090, 2097, 220, 380 from BASF; for example, including but not limited to VORANOL™ 2000LM, 1000LM, 2070, 2100, 2140, 220-037N, 232-034N, 3000LM, 3003LM, 3003N, 3010N, 3180, 4000LM, 4240, 4701, 4053, 6150, 8000LM, CP1421, CP6001, CP6055 from Dow Chemistry; and DL-400, DL-700, DL-1000D, DL-2000D, DL-3000D, DL-4000D from Dongda; or can be made by known methods.

(iii) In an embodiment, the chain extender is a polyol, a polyamine, or an alkylol amine, with a functionality of 2 to 4.5 and a molecular weight smaller than 500, for example, ethylene glycol, propylene glycol, 1, 4-butanediol, diethylene glycol, glycerol, trimethylolpropane, 1,4-cyclohexanediol, dimethylene benzenediol, hydroquinone di-p-hydroxyethyl ether, resorcinol hydroxy ether, diethyl toluene diamine, 3,5-dimethyl thio-toluene diamine, ethanol amine, diethanol amine, triethanol amine, triisopropanol amine, N,N'-bis(2-hydroxypropy) aniline, etc. The polyols, polyamines, or alkylol amines are available from various commercial sources, for example, including but not limited to, VORANOL™ CP 300, 450, 220-260, WD 2104 from Dow Chemistry; for example, including but not limited to Pluracol P410R, 1016, 1158, TP440, 1168, 1578, 736, PEP550, SG-360, SG-470, etc., from BASF; or can be made by known methods.

(iv) The photoinitiator includes but is not limited to 2,4,6-trimethylbenzoyl ethylphosphinate, 2,4,6-(trimethylbenzoyl)-diphenyl phosphine oxide (TPO), 2-methyl-1-[4-methylthiophenyl]-2-morpholinyl-1-propanone, 2-isopropylthioxanthone (2, 4 isomer mixture), ethyl 4-dimethylamino benzoate, 1-hydroxy-cyclohexyl-phenyl ketone, 2-hydroxy-2-methyl-1-pheny-1-propanone, benzoin dimethyl ether, o-benzoyl benzomethoxycarbonyl, 4-chlorobenzophenone, 4-phenylbenzophenone, etc.

In another embodiment, the photosensitive resin composition further includes a pigment and an additive. With respect to 100 parts by weight of the photosensitive resin composition, the photosensitive resin composition further includes: (v) 0.1 to 1 parts by weight of the pigment; and (vi) 0.1 to 20 parts by weight of the additive. In an embodiment, the pigment is a pigment paste curable under UV. The pigment includes but is not limited to SYMULER FAST YELLOW 4335, 4400T, 4414S, 4414S, 4418, SYMULER FAST Orange V, SYMULER FAST OrangeK, SYMULER Red 3109, 3013P, 3014G, 3090, 3110, etc. The additive includes an antioxidant, a light stabilizer, a filler, etc.

The present disclosure will be described in more detail with reference to the preparation examples as follows. However, the preparation examples are exemplary embodiments and the present disclosure is not limited thereto.

Preparation Example 1 A dual-cure phase-separation type photosensitive resin composition for continuous 3D printing with high precision is prepared from the following materials: 30% of SR306 (purchased from Sartomer Company), 11.65% of dicyclohexylmethane-4,4'-diisocyanate (HMDI), 53.52% of polyether polyol VORANOL4000LM (purchased from Dow Chemical Company), 0.03% of organotin catalyst T12, 2.8% of chain extender 1, 4-butanediol, and 2% of photoinitiator TPO, wherein all of the percentages are weight percentages.

The preparation method includes two steps: (1) preparing the prepolymer: 53.52% of polyether polyol VORANOL4000LM is vacuum dried at 120° C. for 4h with a vacuum degree of −0.09 MPa, then the temperature is lowered to 80° C., and then 11.65% of dicyclohexylmethane-4,4'-diisocyanate (HMDI) and 0.03% of organotin catalyst T12 are added to carry out a reaction which is terminated after 4h. A measurement is performed according to the fourth part, "the measurement of the content of the isocyanate radical", of "aromatic isocyanate for producing polyurethane plastic" of GB/T 12009.4-2016 Standard; (2) preparing the dual-cure photosensitive resin: 30% of SR306, 2.8% of chain extender 1, 4-butanediol, and 2% of photoinitiator TPO are added into the prepolymer prepared in the step (1) and stirred for 30 min to 1h until being completely dissolved.

The prepared photosensitive resin composition is cured and formed into a 0.3 mm of membrane under the irradiation of ultraviolet light. The irradiation conditions are as follows. The wavelength is 385 nm of. The intensity of the ultraviolet light is 20 mw/cm$^2$. The irradiation time is 10s. Then the reaction is continued at 80° C. for 12h. The transmittance of the membrane formed by the photosensitive resin is measured according to the measurement method of the transmittance and the haze of the transparent plastic recorded in GB/T 2410-2008.

The Comparative Examples 1-3 and Examples 1-7 adopt the same or similar preparation methods as the Example 1. The materials used in the Comparative Examples 1-3 and Examples 1-7 and the measurement results are shown in Table 1. In rows numbered 1-5 in Table 1, the product models of the materials are shown in the upper sub-rows and the weight percentages are shown in the lower sub-rows.

TABLE 1

| No | Material | | Comp. Example 1 | Comp. Example 2 | Comp. Example 3 | Example 1 | Example 2 |
|---|---|---|---|---|---|---|---|
| 1 | Acrylate having cross-linkable double bond | | SR306 30% | SR306 30% | SR306 30% | SR306 30% | SR306 30% |
| 2 | Polyurethane prepolymers | Isocyanate | HMDI 19.97% | HMDI 14.75% | HMDI 12.73% | HMDI 11.65% | HMDI 12.32% |
| | | Polyether polyol | VORANOL 1000LM 45.2% | VORANOL 2000LM 50.42% | VORANOL 3000LM 52.44% | VORANOL 4000LM 53.52% | VORANOL 4701 52.85% |
| | | Catalyst T12 | DABCO T12 0.03% | DABCO T12 0.03% | DABCO T12 0.03% | DABCO T12 0.03% | DABCO T12 0.03% |
| 3 | Chain extender | | 1,4-butanediol 2.8% | 1,4-butanediol 2.8% | 1,4-butanediol 2.8% | 1,4-butanediol 2.8% | 1,4-butanediol 2.8% |
| 4 | Photoinitiator | | TPO 2% | TPO 2% | TPO 2% | TPO 2% | TPO 2% |
| 5 | Others | | — | — | — | — | — |
| | | | | | Results | | |
| 1 | Molecular weight of polyether polyol | | 1000 | 2000 | 3000 | 4000 | 4957 |
| 2 | NCO % content in polyurethane prepolymer | | 3.98% | 3.97% | 3.99% | 4.00% | 4.00% |
| 3 | Transmittance of shaped photosensitive resin | | 90% | 88% | 86% | 78% | 62% |

| No | Material | | Example 3 | Example 4 | Example 5 | Example 6 | Example 7 |
|---|---|---|---|---|---|---|---|
| 1 | Acrylate having cross-linkable double bond | | SR306 30% | SR306 30% | SR306 31.03% | SR454 30.83% | SR531 26.8% |
| 2 | Polyurethane prepolymers | Isocyanate | HMDI 11.56% | HMDI 9.95% | HMDI 11.64% | HMDI 11.56% | HMDI 11.56% |
| | | Polyether polyol | VORANOL CP6001 53.61% | VORANOL 8000LM 55.22% | Pluracol 1026 53.52% | VORANOL CP6001 53.61% | VORANOL CP6001 53.61% |
| | | Catalyst T12 | DABCO T12 0.03% | DABCO T12 0.03% | DABCO T12 0.01% | DABCO T12 0.1% | DABCO T9 0.03% |
| 3 | Chain extender | | 1,4-butanediol 2.8% | 1,4-butanediol 2.8% | 1,4-butanediol 2.8% | 1,4-butanediol 2.8% | VORANOL CP300 5.9% |
| 4 | Photoinitiator | | TPO 2% | TPO 2% | TPO 1% | TPO 1% | TPO 2% |
| 5 | Others | | — | — | — | Titanium white powder 0.1% | Light stabilizer 0.1% |
| | | | | | Results | | |
| 1 | Molecular weight of polyether polyol | | 6120 | 80000 | 6120 | 6120 | 6120 |
| 2 | NCO % content in polyurethane prepolymer | | 3.96% | 3.96% | 3.99% | 4.00% | 3.98% |
| 3 | Transmittance of shaped photosensitive resin | | 51% | 45% | 52% | 47% | 48% |

Figure 2:
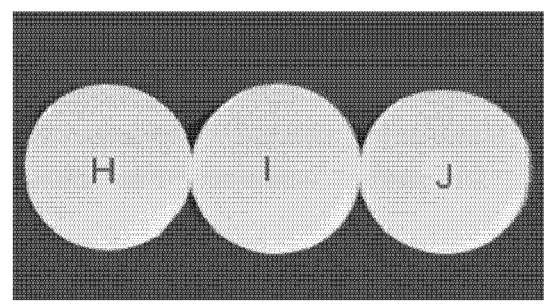

Experiment Conclusion (1) The results of the Comparative Examples 1-3 and the Examples 1-7 show that with the increase of the molecular weight of the polyether polyol, the phase separation phenomenon gradually occurs in the product formed from the photosensitive resin composition, and the transmittance of the product is gradually decreased. Referring to FIGS. 1 to 2, A to C, D to G (from left to right) in FIG. 1 are respectively corresponding to the solidified products of the photosensitive resin compositions of Comparative Examples 1-3 and Examples 1-4. H to J (from left to right) in FIG. 2 are respectively corresponding to the solidified products of the photosensitive resin compositions of Examples 5-7.

Figure 3:
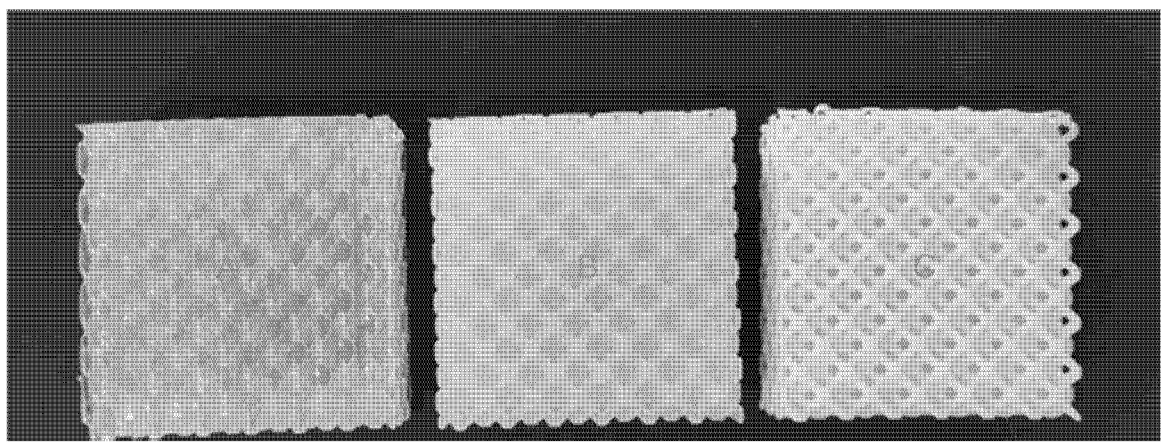
FIG. 3 shows effect photos of samples obtained by 3D printing with the photosensitive resin compositions of Comparative Example 1, Example 1, and Example 4 of the present disclosure.

(2) The result of Comparative Example 1 indicates that when the molecular weight of the polyether polyol is 1000, the transmittance of the photosensitive resin composition reaches 90%. The left in FIG. 3 is the grid formed by 3D printing using the photosensitive resin of Comparative Example 1 as the raw material. The grid is seriously hazy, and the shape of the product has very low precision. The result of Example 1 indicates that when the molecular weight of the polyether polyol is 4000, the phase separation occurs in the photosensitive resin composition, the whiting phenomenon is observed in the composition changing from liquid to solid, and the transmittance is lowered to 78%. The middle in FIG. 3 is the grid formed by 3D printing using the photosensitive resin composition of Example 1 as the raw material. The precision is increased as compared to Comparative Example 1. The result of Example 2 indicates that when the molecular weight of the polyether polyol reaches 4957, the phase separation occurs in the photosensitive resin composition, the obvious whiting phenomenon is observed in the composition changing from liquid to solid, and the transmittance is 62%. The result of Example 3 indicates that when the molecular weight of the polyether polyol is 6120, the phase separation is obvious in the photosensitive resin composition, and the transmittance is lowered to 51%. The result of Example 4 indicates that when the molecular weight of the polyether polyol reaches 8000, the transmittance of the photosensitive resin composition is lowered to 45%. The right in FIG. 3 is the grid formed by 3D printing using the photosensitive resin composition of Example 4 as the raw material. The grid shows obvious whiting phenomenon, and the precision of the printed product is very high.

The results of Examples 5-7 indicates that as compared to Example 3, when the molecular weight of the polyether polyol is also 6120 and the additive such as the titanium white powder or the light stabilizer is added, the transmittance of the photosensitive resin composition is further decreased, which results a higher precision of the printed product.

As compared to the prior art, the present disclosure has the following beneficial effects.

(1) It was found in the experiments that the transmittance of the photosensitive resin composition can be decreased and obvious phase separation phenomenon and obvious whiting phenomenon can occur in the solidification process of the photosensitive resin composition if the polyether polyol with the molecular weight larger than or equal to 4000 is used. When the molecular weight of the polyether polyol reaches 8000, the transmittance of the photosensitive resin composition can be decreased to 45%. Thus, mechanical parts and components can be made with higher precision by using the dual-cure phase-separation type photosensitive resin composition.

(2) As compared to the multi-cure photosensitive resin made by end blocking, the post-processing temperature is decreased from 120° C. of the end blocking to lower than 80° C. Thus, the producing process is more environmental friendly, while the cost is significantly decreased.

Although the present disclosure is described with reference to the embodiments which are currently considered to be exemplary in practice, it is to be understood that the present disclosure is not limited to the disclosed embodiments. On the contrary, the present disclosure is intended to cover various modifications and equivalent arrangements within the spirit and the scope of the appended claims. Therefore, it is to be understood that the above-described embodiments are exemplary and will not limit the present disclosure in any way.

What is claimed is:

1. A dual-cure phase-separation type photosensitive resin composition for continuous 3D printing with high precision, wherein the photosensitive resin composition comprises:
    an acrylate having a cross-linkable double bond;
    a polyurethane prepolymer;
    a chain extender; and
    a photoinitiator; wherein
        the polyurethane prepolymer has an isocyanate active group, and
        the polyurethane prepolymer having the isocyanate active group is produced by a reaction between an isocyanate and a polyether polyol with a molecular weight larger than or equal to 4000 under heating and catalytic action.

2. The dual-cure phase-separation type photosensitive resin composition for continuous 3D printing with high precision of claim 1, wherein the photosensitive resin composition comprises 5 to 30 parts by weight of the acrylate having the cross-linkable double bond, 65.2 to 70 parts by weight of the polyurethane prepolymer, 0.5 to 20 parts by weight of the chain extender, and 0.1 to 6 parts by weight of the photoinitiator with respect to 100 parts by weight of the photosensitive resin composition.

3. The dual-cure phase-separation type photosensitive resin composition for continuous 3D printing with high precision of claim 1, wherein the acrylate having the cross-linkable double bond is selected from the group consisting of an acrylate monomer having one or more double bonds capable of participating in free radical reaction, an acrylate prepolymer having one or more double bonds capable of participating in free radical reaction, and a combination thereof.

4. The dual-cure phase-separation type photosensitive resin composition for continuous 3D printing with high precision of claim 3, wherein the acrylate monomer having one or more double bonds capable of participating in free radical reaction is selected from the group consisting of a monofunctional acrylate monomer with a functionality equal to 1, a multi-functional acrylate monomer with a functionality larger than 1, and a combination thereof.

5. The dual-cure phase-separation type photosensitive resin composition for continuous 3D printing with high precision of claim 3, wherein the acrylate prepolymer having one or more double bonds capable of participating in free radical reaction is selected from of the group consisting of polyurethane acrylate, epoxy acrylate, polyester acrylate, and combinations thereof.

6. The dual-cure phase-separation type photosensitive resin composition for continuous 3D printing with high precision of claim 1, wherein an amount of the isocyanate active group in the polyurethane prepolymer is 2 to 20 percent by weight.

7. The dual-cure phase-separation type photosensitive resin composition for continuous 3D printing with high precision of claim 1, wherein the isocyanate used in the reaction under heating is selected from of the group consisting of toluene diisocynate, diphenylmethane diisocyanate, hexamethylene diisocyanate, isophorone diisocyanate, dicyclohexylmethane-4,4'-diisocyanate, xylylene diisocynate, tetramethyl-m-xylylene diisocyanate, methylcyclohexane diisocyanate, 1,4-phenylene diisocyanate, norbornane diisocyanate, 1,4-cyclohexane diisocyanate, and combinations thereof.

8. The dual-cure phase-separation type photosensitive resin composition for continuous 3D printing with high precision of claim 1, wherein the polyether polyol is produced by addition polymerization of an initiator, ethylene oxide, propylene oxide, butylene oxide in the presence of a catalyst, wherein the initiator is a compound containing an active hydrogen group, and the catalyst is an organobismuth catalyst, an organotin catalyst, or a combination thereof for the synthesis of polyurethane.

9. The dual-cure phase-separation type photosensitive resin composition for continuous 3D printing with high precision of claim 1, wherein the polyurethane prepolymer is synthesized by using the following method: (1) dehydrating the polyether polyol by vacuuming, wherein the vacuuming satisfies the condition: the temperature is 100 to 120° C. and the vacuum degree is −0.08 to −0.1 MPa; (2) adding weighed isocyanate and 0.01 to 0.2 parts by weight of the catalyst, and then reacting at 60 to 90° C. for 3 to 5 hours.

10. The dual-cure phase-separation type photosensitive resin composition for continuous 3D printing with high precision of claim 1, wherein the chain extender is a polyol, a polyamine, or an alkylol amine, with a functionality of 2 to 4.5 and a molecular weight smaller than 500.

11. The dual-cure phase-separation type photosensitive resin composition for continuous 3D printing with high precision of claim 1, wherein the chain extender is selected from the group consisting of ethylene glycol, propylene glycol, 1,4-butanediol, diethylene glycol, glycerol, trimethylolpropane, 1,4-cyclohexanediol, dimethylene benzenediol, hydroquinone di-3-hydroxyethyl ether, resorcinol hydroxy ether, diethyl toluene diamine, 3,5-dimethyl thiotoluene diamine, ethanol amine, diethanol amine, triethanol amine, triisopropanol amine, N,N'-di(2-hydroxypropy) aniline, and combinations thereof.

12. The dual-cure phase-separation type photosensitive resin composition for continuous 3D printing with high precision of claim 1, wherein the photoinitiator is selected from of the group consisting of 2,4,6-trimethylbenzoyl ethylphosphinate, 2,4,6-(trimethylbenzoyl)-diphenyl phosphine oxide, 2-methyl-1-[4-methylthiophenyl]-2-morpholinyl-1-propanone, 2-isopropylthioxanthone (2, 4 isomer mixture), ethyl 4-dimethylamino benzoate, 1-hydroxy-cyclohexyl-phenyl ketone, 2-hydroxy-2-methyl-1-pheny-1-propanone, benzoin dimethyl ether, o-benzoyl benzomethoxycarbonyl, 4-chlorobenzophenone, 4-phenylbenzophenone, and combinations thereof.

13. The dual-cure phase-separation type photosensitive resin composition for continuous 3D printing with high precision of claim 1, wherein the photosensitive resin composition comprises 10 to 30 parts by weight of the acrylate having the cross-linkable double bond, 65.2 parts by weight of the polyurethane prepolymer, 1 to 10 parts by weight of the chain extender, 0.3 to 5 parts by weight of the photoinitiator, 0.1 to 1 part by weight of a pigment, and 0.1 to 20 parts by weight of an additive with respect to 100 parts by weight of the photosensitive resin composition, wherein the pigment is a pigment paste curable under UV, and the additive comprises an antioxidant, a light stabilizer, and a filler.

14. The dual-cure phase-separation type photosensitive resin composition for continuous 3D printing with high precision of claim 1, wherein a molecular weight of the polyether polyol is larger than or equal to 4000.

15. The dual-cure phase-separation type photosensitive resin composition for continuous 3D printing with high precision of claim 1, wherein a molecular weight of the polyether polyol is in a range from 5500 to 12000.

16. The dual-cure phase-separation type photosensitive resin composition for continuous 3D printing with high precision of claim 1, wherein a molecular weight of the polyether polyol is 8000.

17. The dual-cure phase-separation type photosensitive resin composition for continuous 3D printing with high precision of claim 1, wherein an average functionality of the polyether polyol is 2 to 3.

18. The dual-cure phase-separation type photosensitive resin composition for continuous 3D printing with high precision of claim 1, wherein a transmittance of a shaped photosensitive resin cured from the dual-cure phase-separation type photosensitive resin composition is smaller than or equal to 78%.

19. A dual-cure phase-separation type photosensitive resin composition for continuous 3D printing with high precision, wherein the photosensitive resin composition comprises:
  an acrylate having a cross-linkable double bond;
  a polyurethane prepolymer;
  a chain extender; and
  a photoinitiator; wherein
    the polyurethane prepolymer has an isocyanate active group,
    the polyurethane prepolymer having the isocyanate active group is produced by a reaction between an isocyanate and a polyether polyol with a molecular weight larger than or equal to 4000 under heating and catalytic action, and
    an amount of the isocyanate active group in the polyurethane prepolymer is 2 to 20 percent by weight.

20. A dual-cure phase-separation type photosensitive resin composition for continuous 3D printing with high precision, wherein the photosensitive resin composition comprises:
  an acrylate having a cross-linkable double bond;
  a polyurethane prepolymer;
  a chain extender; and
  a photoinitiator; wherein
    the polyurethane prepolymer has an isocyanate active group,
    the polyurethane prepolymer having the isocyanate active group is produced by a reaction between an isocyanate and a polyether polyol under heating and catalytic action, and
    a molecular weight of the polyether polyol is in a range from 8000 to 12000.

* * * * *